(12) United States Patent
Nussbaum

(10) Patent No.: US 6,987,473 B1
(45) Date of Patent: Jan. 17, 2006

(54) DIGITAL SIGNAL-RATE CONVERTER AND SYSTEMS INCORPORATING SAME

(75) Inventor: Howard S. Nussbaum, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/899,698

(22) Filed: Jul. 27, 2004

(51) Int. Cl.
*H03M 3/00* (2006.01)

(52) U.S. Cl. ...................... 341/143; 341/144

(58) Field of Classification Search ............... 341/144, 341/120, 123, 122, 61, 143; 375/269, 271, 375/281, 283, 308, 343, 295, 296, 298, 261; 332/103

See application file for complete search history.

(56) References Cited

U.S. PATENT DOCUMENTS

| | | | | |
|---|---|---|---|---|
| 5,594,443 A | * | 1/1997 | Lam ........................... | 341/144 |
| 5,930,299 A | * | 7/1999 | Vannatta et al. ............ | 375/269 |
| 6,771,910 B1 | * | 8/2004 | Napier et al. ................ | 398/185 |

OTHER PUBLICATIONS

A. Hussein and W. Kuhn, "Bandpass Sigma/Delta Employing Undersampling of RF Signals for Wireless Communications," IEEE Transactions on Circuits and Systems II, vol. 47, No. 7, Jul. 2000, pp. 614-620.

* cited by examiner

*Primary Examiner*—Brian Young
(74) *Attorney, Agent, or Firm*—Leonard A. Alkov; Karl A. Vick

(57) ABSTRACT

A digital signal-rate converting system. The system includes a first mechanism for receiving a digital input signal characterized by a first rate. A second mechanism interleaves the digital input signal in accordance with a predetermined pattern to yield an adjusted-rate digital signal. The adjusted-rate digital signal is representative of the digital input signal, such as a bandpass signal. In a more specific embodiment, the digital signal-rate converting system is an input interface of a rate-converting Digital-to-Analog Converter (DAC). The rate-converting DAC includes a DAC module, such as multi-bit or a 1-bit DAC module, for receiving the adjusted-rate digital signal and providing an analog output signal with a desired bandwidth or center frequency in response thereto. In the specific embodiment, the adjusted-rate digital signal approximates the digital input signal and is characterized by a rate based on a desired center frequency of the analog output signal. In this embodiment, the DAC module includes a high-speed DAC characterized by a DAC hold rate that matches the rate of the adjusted-rate digital signal.

42 Claims, 7 Drawing Sheets

DIGITAL SIGNAL-RATE CONVERTER AND SYSTEMS INCORPORATING SAME

BACKGROUND OF THE INVENTION

1. Field of Invention

This invention relates to digital signal-rate converters. Specifically, the present invention relates to rate-converting systems, such as bandpass Digital-to-Analog Converters (DACs), for converting digital signals into output signals with desirable bandwidth characteristics, such as a bandpass signal.

2. Description of the Related Art

Digital-to-Analog Converters (DACs) are employed in various demanding applications including Direct Digital Synthesizers (DDSs), arbitrary waveform generators, and transmitters. Such applications demand circuit components and DACs that output signals with desired center frequencies and/or bandwidths.

DACs are particularly important in radar and communications systems, where transmitters must often transmit relatively high Radio Frequency (RF) signals derived from relatively low-speed digital signals. Such systems often employ transmit chains with DACs that convert digital baseband signals to analog RF signals in preparation for wireless transmission. Accompanying processor and memory speed constraints often necessitate relatively low-speed digital DAC input signals. The low-speed digital input signals may yield relatively low-frequency analog DAC output signals. The low frequency analog output signals must often be upconverted, via analog mixers and filters, to relatively high-frequency RF signals. The requisite mixing stages, which often include baseband-to-IF mixers, IF-to-RF mixers, and various filters, increase system costs and complexity.

Alternatively, DAC alias frequency regions may be employed to yield desired RF output signals from relatively low-speed digital input signals. Unfortunately, this approach generates distortion, necessities difficult filtering, and provides a relatively poor frequency response.

Generally, conventional DACs have limited bandpass capabilities and cannot provide analog output signals centered at desired bandpass frequencies, such as RF. Accordingly, existing DAC operations often require signal frequency translation via filtering and mixing either before or after the DAC. Requisite DAC interfacing may limit the speed of the DAC and consume excess power.

Hence, a need exists in the art for a DAC that can selectively convert a digital signal into an analog signal with a desired center frequency without the need for additional mixers and filters to implement frequency translation.

SUMMARY OF THE INVENTION

The need in the art is addressed by the digital signal-rate converting system of the present invention. Generally, the system includes a first mechanism for receiving a digital input signal characterized by a first rate. A second mechanism interleaves the digital input signal in accordance with a predetermined pattern and provides an adjusted-rate digital signal in response thereto. The adjusted-rate digital signal is representative of the digital input signal, such as a bandpass signal.

In the illustrative embodiment, the inventive system is adapted for use with a rate-converting Digital-to-Analog Converter (DAC) employed in a radar or wireless transceiver. In a more specific embodiment, the digital signal-rate converting system is an input interface of a rate-converting Digital-to-Analog Converter (DAC). The rate-converting DAC includes a DAC module, such as multi-bit or a 1-bit DAC module, for receiving the adjusted-rate digital signal and providing an analog output signal with a desired bandwidth or center frequency in response thereto. In this embodiment, the adjusted-rate digital signal approximates the digital input signal and is characterized by a rate based on a desired center frequency of the analog output signal.

In the specific embodiment, the rate-converting DAC includes a high-speed DAC characterized by a DAC hold rate that matches the rate of the adjusted-rate digital signal. Specifically, the first rate is $1/(NT)$, where N is a constant integer, and the DAC hold rate is $1/T$. N is an odd integer chosen relative to the DAC rate so that a center frequency ($f_c$) of the analog output signal is $1/(4T)$, and wherein the rate of the digital input signal is $(4/N)f_c$. The input interface further includes plural sampling switches for increasing a rate of the digital input signal by a factor of N and selectively interleaving portions of the digital input signal at predetermined rates to facilitate providing the adjusted-rate signal. The input interface includes a sequence generator for applying a pattern to the digital input signal to facilitate establishing appropriate signs of bits of the adjusted-rate digital signal.

The novel design of one embodiment of the present invention is facilitated by the input interface, i.e., the digital signal-rate converting system, which approximates the digital input signal with an approximation, i.e., the adjusted rate signal, which is characterized by a different rate than the digital input signal. The input interface can then feed the high-speed DAC module, which can then output a desired signal directly based on the adjusted-rate digital signal. The input interface uses subsampling and interleaving and does not require any arithmetic computing or mixing. Accordingly, the rate-converting DAC obviates additional expensive and inefficient mixing circuitry to implement requisite frequency conversions.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
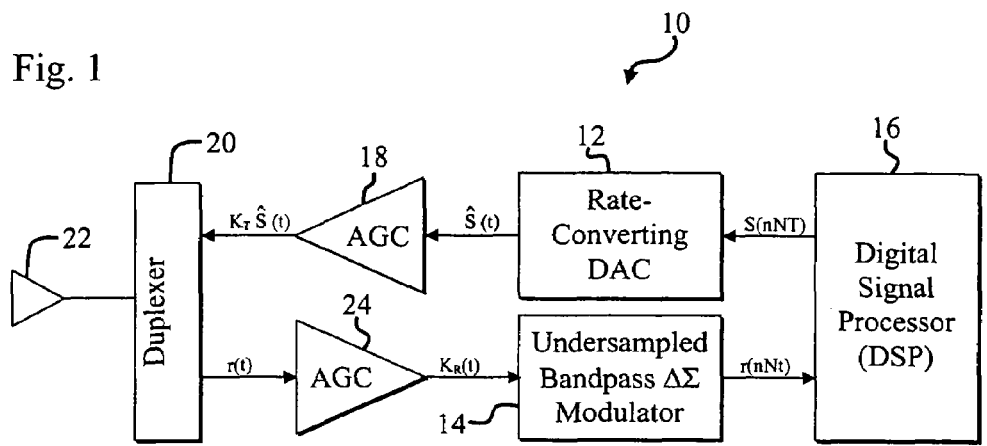
FIG. 1 is a diagram of a transmit/receive system representative of a radar or a wireless transceiver employing a rate-converting DAC and a delta sigma ($\Delta\Sigma$) modulator according to an embodiment of the present invention.

FIG. 1 is a diagram of a transmit/receive system representative of a radar or a wireless system 10 employing a rate-converting DAC 12 and an undersampled bandpass delta sigma (ΔΣ) modulator 14 according to an embodiment of the present invention. For clarity, various well-known components, such as power supplies, clocking circuits, and so on, have been omitted from the figures. However, those skilled in the art with access to the present teachings will know which components to implement and how to implement them to meet the needs of a given application.

The system 10 includes a signal processor 16 that provides output to the rate-converting DAC 12 and receives input from the undersampled ΔΣ modulator 14. An output of the rate-converting DAC 12 is connected to an input of a transmit-chain Automatic Gain Control (AGC) circuit 18. An output of the transmit-chain AGC 18 is connected to an input of a duplexer 20, which is connected to an antenna 22. An output of the duplexer 20 is connected to an input of a receive-chain AGC 24, an output of which is connected to an input of the undersampled ΔΣ modulator 14. An output of the undersampled ΔΣ modulator 14 is input to the signal processor 16. The signal processor 16, rate-converting DAC 12, transmit chain AGC 18, duplexer 20, and antenna 22 form a transmit chain. Similarly, the antenna 22, duplexer 20, receive-chain AGC 24, undersampled ΔΣ modulator 14, and the signal processor 16 form a receive chain.

In operation, the signal processor 16 provides a digital signal, such as a baseband signal, to the rate-converting DAC 12. The rate-converting DAC 12 then selectively adjusts the rate of the digital signal and converts it to an RF signal. The baseband RF signal is then amplified by the transmit-chain AGC 18 and then wirelessly transmitted via the duplexer 20 and the antenna 22. The duplexer 20 facilitates the sharing of antenna resources between transmit and receive chains.

Conventionally, complex, bulky, and expensive analog mixers are often required to convert baseband signals output from the signal processor 16 into Intermediate Frequency (IF) signals. An additional set of mixers, called upconverters, is often required to convert the resulting IF signals to appropriate baseband RF signals. Hence, use of the rate-converting DAC 12 may obviate problematic analog mixing stages in the transmit chain.

The system 10 may receive RF signals via the antenna 22. The duplexer 20 then forwards received RF signals to the receive-chain AGC 24. The receive-chain AGC 24 adjusts the gain of the received RF signals before forwarding them to the undersampled bandpass ΔΣ modulator 14. The undersampled bandpass ΔΣ modulator 14 converts the relatively high-frequency RF signals to relatively low rate digital signals, which are then input to the signal processor 16. Those skilled in the art will appreciate that the AGCs 18, 24 may be omitted or replaced with other types of amplifiers without departing from the scope of the present invention.

Conventionally, various analog mixers, called downconverters, are employed to convert received RF signals to IF signals. Additional downconverters are often employed to convert the IF signals to baseband signals, which are then forwarded to the signal processor 16. Use of the undersampled ΔΣ modulator 14 may obviate problematic analog mixing stages in the receive chain.

The undersampled ΔΣ modulator 14 employs a rate-converting DAC, which is similar to the rate converting DAC 12, to obviate problematic analog mixing stages as discussed more fully below. The DAC 12 receives data at a rate of 1/(NT), where N is a predetermined constant integer, and T is a sampling interval characterizing the received data. The DAC 12 employs an interface that operates on the received data to enable an accompanying DAC module to be driven at a rate of 1/T, which is discussed more fully below.

Figure 2:
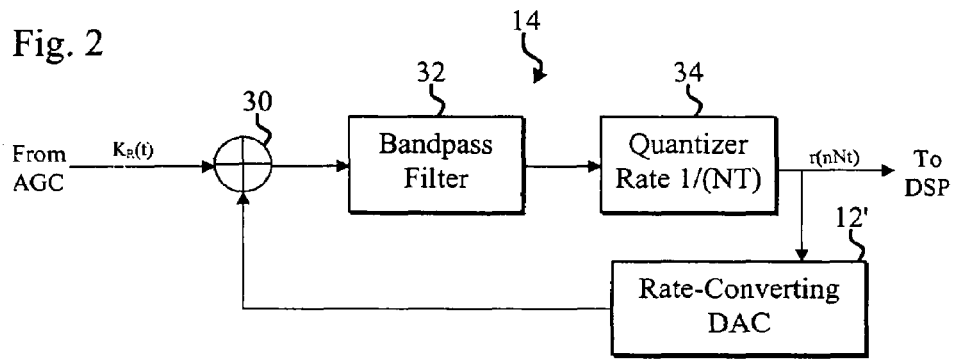
FIG. 2 is a more detailed diagram of the $\Delta\Sigma$ modulator of the system of FIG. 1, which employs a rate converting DAC.

FIG. 2 is a more detailed diagram of the ΔΣ modulator 14 of the system 10 of FIG. 1. The ΔΣ modulator 14 includes an adder 30 that receives input from the receive-chain AGC 24 of FIG. 1 and from an internal rate-converting DAC 12'. The rate-converting DAC 12' is similar to the rate-converting DAC 12 employed in the transmit chain of FIG. 1.

Output from the adder 30 is input to a bandpass filter 32. An output of the bandpass filter 32 is connected to an input of a quantizer 34, which is characterized by a rate of 1/(NT), where T is a sampling interval of the DAC 12', and N is a predetermined constant integer. An output of the quantizer 34 is fed back to an input of the internal rate-converting DAC 12'. The output of the quantizer 34 represents the output of the undersampled ΔΣ modulator 14.

Conventionally, an undersampled bandpass ΔΣ modulator includes a conventional DAC (not shown) with a hold rate of 1/(NT). An additional analog mixer is required to convert the output of the convention al DAC to an appropriate bandpass signal compatible with the adder of the conventional undersampled bandpass ΔΣ modulator. Use of the rate-converting DAC 12', which has an input rate of 1/(NT) and a hold rate of 1/T, obviates the additional analog mixer. A conventional undersampled bandpass ΔΣ modulator is discussed more fully in a paper entitled BANDPASS SIGMA/DELTA EMPLOYING UNDERSAMPLING OF RF SIGNALS FOR WIRELESS COMMUNICATIONS, by A. Hussein and W. Kuhn, published in IEEE Transactions on Circuits and Systems II, vol. 47, No. 7, July 2000, pp. 614–620.

Figure 3:
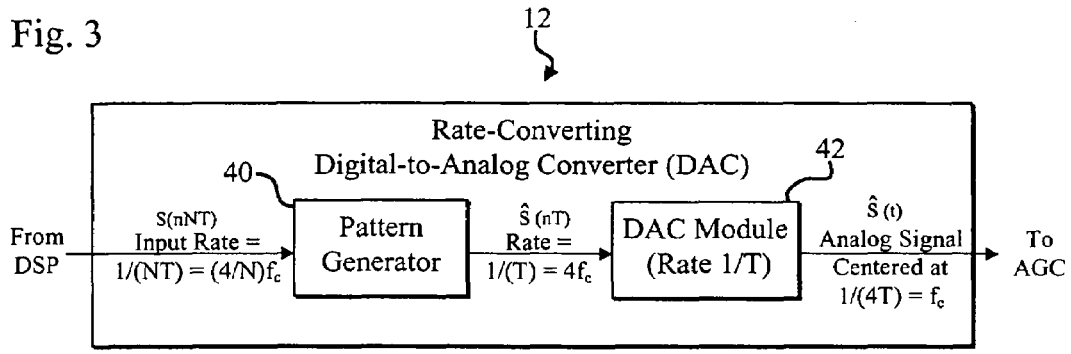
FIG. 3 is a more detailed diagram of the rate-converting DAC of FIG. 1 and FIG. 2.

FIG. 3 is a more detailed diagram of the rate-converting DAC 12 of FIG. 1, which is also illustrative of the DAC 12' of FIG. 2. The rate-converting DAC 12 is characterized by an input rate of 1/(NT) and a hold rate of 1/T, where T is a hold time associated with the rate-converting DAC 12 and N is a predetermined constant odd integer.

The rate-converting DAC 12 includes a pattern generator 40 connected in series with a high-speed DAC module 42. The pattern generator 40 receives digital input signal, such as (s(nNT)), where n is a digital time variable, from the signal processor 16 of FIG. 1 at the rate of 1/(NT). The pattern generator 40 then outputs an adjusted-rate digital approximation (ŝ(nT)) of the digital input signal to the high-speed DAC module 42 at the N-times faster rate of 1/T.

The digital approximation ŝ(nT) is input to the high-speed DAC module 42, which provides an analog output signal having a center frequency ($f_c$) of approximately 1/(4T). In the present specific embodiment, the center frequency 1/(4T) is an RF center frequency. Note that 1/(NT), the rate of the digital input signal, is $(4/N)f_c$.

In operation, the rate-converting DAC 12 provides an RF signal in the desired passband having desired alias properties based on a relatively slow digital input signal (s(nNT)). Conventionally, converting a relatively slow (low-rate) digital signal into a bandpass RF signal requires extra mixing stages. The pattern generator 40 acts as an efficient DAC input interface that converts the slow rate input signal (s(nNT)) to the fast approximation (ŝ(nT)). The pattern generator 40 is efficient since, no additional arithmetic operations such as signal mixing or multiplying are required. This obviates additional mixers or signal multipliers to facilitate frequency conversion.

The fast approximation (ŝ(nT)) can then feed the DAC module 42 at a rate sufficient to yield the bandpass output signal centered at 1/(4T), thereby obviating the need for additional rate-converting mixers. The rate (1/T) of the fast approximation (ŝ(nT)) may be set based on the desired center frequency to be output from the DAC module 42 and based on properties of the DAC module 42, such as output rate.

The DAC module 42 may be implemented via a conventional high-speed DAC having a hold rate of 1/T, which is application specific. Those skilled in the art will appreciate that DACs having different output rates may be employed without departing from the scope of the present invention. The speed of the interface, i.e., the pattern generator 40, is related to input signal rate and/or bandwidth requirements.

To generate the fast approximation (ŝ(nT)), the pattern generator 40 employs subsampling and signal interleaving in accordance with a predetermined pattern as discussed more fully below. Accordingly, the pattern generator 40 does not require undesirable arithmetic computations, such as signal multiplying to implement digital frequency mixing.

The pattern generator 40 further includes plural sampling switches for increasing a rate of the digital input signal by a factor of N and selectively interleaving portions of the digital input signal (s(nNT)) at predetermined rates to facilitate providing the adjusted-rate digital approximation signal (ŝ(nT)). The pattern generator 40 includes a sequence generator, as discussed more fully below, for applying a predetermined pattern to the digital input signal to facilitate establishing appropriate signs of bits of the adjusted-rate digital approximation signal (ŝ(nT)). The pattern is based on an approximation of an input signal. The plural sampling switches are arranged based on the approximation, and the adjusted-rate digital signal is representative of the approximation (ŝ(nT)). The approximation (ŝ(nT)) is obtained by subsampling a representation of the digital input signal by a factor of 2N, where N is a predetermined integer, and then interpolating via nearest-neighbor interpolation as discussed more fully below.

Those skilled in the art will appreciate that rate-converting DAC 12 is not limited to use in radars or transceivers. The rate-converting DAC 12 is particularly useful in applications where frequency or bandwidth conversion is desired after digital-to-analog conversion. The rate-converting DAC 12 is also particularly useful in applications that provide incentives to employ relatively slow DAC interface speeds. For example, consider a Direct Digital Synthesizer (DDS) (not shown) for generating an RF signal directly. The pattern generator 40 is particularly useful when the look-up speed of the DDS's arithmetic operations and associated sine/cosine table lookup operations is slower than the desired input rate to a conventional DAC. In these situations, the pattern generator 40 may efficiently interface the relatively slow speed signal to the DAC by implementing rate conversion via a unique higher-speed digital approximation to the slower-speed digital input signal. Applications, such as arbitrary waveform generators involving relatively slow memory interfaces to accompanying DACs may also particularly benefit through use of the rate-converting DAC 12.

To derive the methods employed by the pattern generator 12 to adjust the rate of a digital input signal, we start with the following representation of an ideal analog output signal s(t):

$$s(t)=I(t)\cos(\omega_c t)+Q(t)\sin(\omega_c t), \quad [1]$$

where $\omega_c$ is the carrier frequency, I(t) is the in-phase signal and Q(t) is the quadrature signal. Both I(t) and Q(t) are narrowband processes centered near zero frequency. Sampling s(t) at the rate T where $$T=(\pi/2)\omega_c \quad [2]$$

results in:

$$s(nT)=I(nT)\cos(n\pi/2)+Q(nT)\sin(n\pi/2), \quad [3]$$

where s(nT) is the ideal sequence that a DAC would use to construct s(t). The pattern generator 40 of the bandpass DAC is adapted to construct a sequence that closely approximates s(nT). The sine terms (Q(nT)sin(nπ/2)) of s(nT) switch from 0 to +/−Q(nT) as n switches from even to odd, respectively, since sin(nπ/2) is 0 for even n and +/−1 for odd n. Similarly, the cosine terms (I(nT)cos(nπ/2)) switch from 0 to +/−I(nT) as n switches from odd to even, respectively. Accordingly, s(nT) may be expressed in terms of even and odd sequences:

$$s2(nT)=I(2nT)(-1)^n \text{ (even sequence)}$$

$$s((2n+1)T)=Q((2n+1)T)(-1)^n \text{ (odd sequence)}, \quad [4]$$

where 2nT are even sampling times and (2n+1)T are odd sampling times.

A novel approximation for s(nT) is obtained by selectively approximating I(nT) and Q(nT) so that the approximation exhibits a form that may be readily implemented via the pattern generator, such as the pattern generator 40 of FIG. 3. With reference the above equations (4), the approximation is obtained by subsampling I(t) and Q(t) by a factor of 2N, where N is a predetermined integer, and then interpolating using nearest-neighbor interpolation, which is illustrated below.

Let p(n) be a sequence representing a discrete time pulse of length 2n where $$p(n) = \begin{cases} 1 & -N \leq n \leq N-1 \\ 0 & \text{Otherwise} \end{cases} \quad [5]$$

Then, I(nT) is approximated by $$\hat{I}(nT) = \sum_m p(n-2mN)I(2mNT). \quad [6]$$

Equation (6) is a formal way of saying that Î(nT) is approximated by I(2mNT) when n and m satisfy −N≤

(n−2mN)≤N−1, where I(2mNT) is the nearest neighbor of the grid of samples spaced by 2N. Note that T (nT) is a function of the sequence I(2mNT).

There are two approximations for Q(nT), termed uniform and nonuniform sampling approximations. For uniform sampling, Q(nT) is approximated as follows:

$$\hat{Q}(nT) = \sum_m p(n - 2mN - N)Q((2mN + N)T), \quad [7]$$

which is similar to the nearest neighbor approach for approximating I(nT), where Q(nT) is a function of the sequence Q((2mN+N)T) m=0,1,2, . . . The term uniform sampling refers to the combined sample times for the nearest neighbor samples of I and Q which are N, 2N, 3N, 4N, . . . , a uniform sequence. For nonuniform sampling, Q(nT) is approximated as follows:

$$\hat{Q}(nT) = \sum_m p(n - 2mN - 1)Q((2mN + 1)T). \quad [8]$$

Note that Q(nT) is a function of the sequence Q((2mN+1)T) m=0,1,2, . . . , where Q(nT) is a function of the sequence Q((2mN+1)T) m=0,1,2, . . . . For this case, the combined sample times for nearest neighbor interpolation are 2N, 2N+1, 4N, 4N=1, . . . , a nonuniform sequence. Equations (7) and (8) define what is meant by nonuniform and uniform sampling. Hence, with reference to equations (4), s(nT) is approximated by the sum of the following terms:

$$\hat{s}(2nT) = \hat{I}(2nT)(-1)^n \quad [9]$$
$$\hat{s}((2n+1)T) = \hat{Q}((2n+1)T)(-1)^n$$

Substituting equations (6)–(8) into equation (9), yields:

$$\hat{s}(2nT) = \sum_m p(2(n - mN))(-1)^{(n-mN)}I(2mNT)(-1)^m. \quad [10]$$

Uniform Sampling $$\hat{s}((2n+1)T) = \sum_m p(2(n - mN - (N-1))) \quad [11]$$
$$(-1)^{(n-mN-(N-1)/2)}Q((22mN + N)T)(-1)^{(m+(N-1)/2)}.$$

Non-uniform Sampling $$\hat{s}((2n+1)T) = \sum_m p(2(n - mN))(-1)^{(n-mN)}Q((2mN + 1)T)(-1)^m. \quad [12]$$

The above equations (10)–(12) represent novel approximations adapted for use with the pattern generator 40.

To develop the simple input pattern to the DAC module 42, let the discrete DAC pattern d(n) be given by:

$$d(n) = \begin{cases} (-1)^{n/2} & -N \leq n \leq N-1 \text{ and } n \text{ even} \\ 0 & \text{Otherwise} \end{cases} \quad [13]$$

Accordingly, s(nT) may be approximated by the following:

Uniform Sampling [14]

$$\hat{s}(nT) = \sum_m d(n - 2mN)I(2mNT)(-1)^m +$$
$$\sum_m d(n - 2mN - N)Q((2mN + N)T)(-1)^{(m+(N-1)/2)}$$
$$= \sum_m d(n - 2mN)s(2mNT) +$$
$$\sum_m d(n - 2mN - N)s((2mN + N)T).$$

Non-Uniform Sampling [15]

$$\hat{s}(nT) = \sum_m d(n - 2mN)I(2mNT)(-1)^m +$$
$$\sum_m d(n - 2mN - 1)Q((2mN + 1)T)(-1)^m$$
$$= \sum_m d(n - 2mN)s(2mNT) +$$
$$\sum_m d(n - 2mN - 1)s((2mN + 1)T).$$

Equations (14) and (15) are only functions of s(2mNT) and one of the sequences s((2mN+N)T) or s((2mN+1)T) for m=0, 1, 2, 3 . . . . The above equations imply:

$$I(2mNT) (-1)^m = s(2mNT) \quad [16]$$

Uniform Sampling $$Q((2mN+N)T) (-1)^{(m+(N-1)/2)} = s((2mN+N)T) \quad [17]$$

Non-Uniform Sampling $$Q((2mN+N)T) (-1)^m = s((2mN+1)T) \quad [18]$$

To begin the development of the implementation, the DAC input sequence ((ŝ(nT)) is divided into regions where the DAC sequence is regular. Regular regions are those sets of adjacent sample values wherein the odd-indexed (odd n) values have similar absolute values (but alternate in sign) and the even-indexed (even n) values have similar absolute values (but alternate in sign).

For the uniform sampling case, the DAC input sequence (ŝ(nT)) is characterized by segments (regular regions) of length N, while for the nonuniform sampling case the sequence (ŝ(nT)) is characterized by segments of length 2N. The length N and length 2N segments of (ŝ(nT)) for uniform and nonuniform sampling, respectively, for the $m^{th}$ period are:

Uniform Sampling

For (N−1)/2 even: {s(2mNT), s((2mN+N) T), −s2 (2mnNT), −s((2mN+N)T), . . . −s(2mNT), −s((2mN+N)T), s(2mNT)}     [19]

For (N−1)/2 odd: {s(2mNT), −s((2mN+N)T), −s(2mNT), s((2mN+N) T), . . . −s(2mN+N), −s((2mN) T)}     [20]

Non-Uniform Sampling

For (N−1)/2 even: {s(2mNT), s((2mN+1)T), −s(2mNT), −s((2mN+1)T), . . . s(2mNT), s((2mN+1)T)}     [21]

For (N−1)/2 odd: {−s(2mNT), −s((2mN+1)T), s(2mNT), s((2mN+1)T), . . . −s(2NT), −s((2mN+1)T)}     [22]

Figure 4:
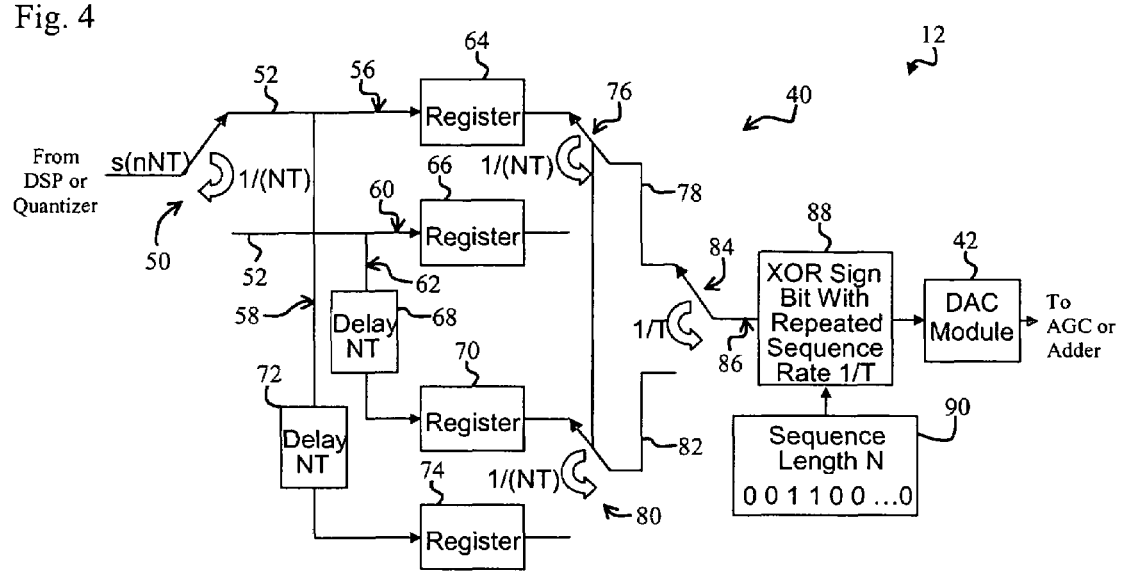
FIG. 4 is a more detailed diagram illustrating rate-converting DAC of FIG. 3 and its accompanying pattern generator 40, which is adapted for uniform sampling.

Examples of the regular regions associated with the above equations (19)–(22) are graphed and discussed more fully below. FIG. 4 is a more detailed diagram illustrating rate-converting DAC of FIG. 3 and its accompanying pattern generator 40, which is adapted for uniform sampling in the present embodiment. The pattern generator 40 includes a first switch 50 that switches a digital input signal (s(nNT)) between a first path 52 and a second path 54 at a rate of 1/(NT). The first switch 50 may be implemented as a 1-2 demultiplexer clocked at a rate of 1/(NT).

The first path 52 splits into a top path 56 and a bottom path 58. The second path 54 splits into a top middle path 60 and a bottom middle path 62. A first register 64 is positioned in the top path 56 and receives input from the first switch 50. A second register 66 is positioned serially in the top middle path 60. The bottom middle path 62 includes a first delay circuit 68 and a third register 70 connected in series. The bottom path includes a second delay circuit 72 and a fourth register 74 connected in series.

A second switch 76 selectively switches outputs of the first register 64 and the second register 66 onto a top output path 78 at a rate of 1/(NT). A third switch 80 selectively switches outputs of the third register 70 and the fourth register 74 onto a bottom output path 82 at a rate of 1/(NT). The second switch 76 and the third switch 80 may be implemented via 2-1 multiplexers clocked at 1/(NT).

A fourth switch 84 selectively switches digital signals on the top output path 78 and the bottom output path 82 onto a middle output path 86 at a rate of 1/T. The fourth switch 84 may be implemented as a 2-1 multiplexer clocked at a rate of 1/T.

The digital signal travelling along the middle output path 86 represents an intermediate digital interleaved signal, whose sign bit is input to an exclusive-OR (XOR) circuit 88. The XOR circuit also receives input from a sequence generator 90 and produces the final sign bit of the digital signal. In the present specific embodiment, the pattern generator 90 produces a sequence comprising a repeated subsequence of length 4. The repeated subsequence is {0, 0, 1, 1}. The output of the XOR circuit 88 represents the output of the pattern generator 40.

In operation, the various switches 50, 76, 80, 84, act as sampling switches that facilitate increasing the rate of the digital input signal (s(nNT)) by a factor of N. In additional to the delay circuits 68, 72, and registers 64, 66, 70, 74, the various switches 50, 76, 80, 84 facilitate selectively interleaving portions of the digital input signal (s(nNT)) that are travelling on the various paths 56, 60, 62, 58 to yield an intermediate digital interleaved signal travelling on the middle output path 86. The XOR circuit 88 performs an XOR operation between sign bits of the intermediate digital interleaved signal and predetermined sequence pattern output from the sequence generator 90 at a rate of 1/T to produce the final sign bit. The resulting signal output from the XOR circuit 88 is a faster-rate approximation to the digital input signal (s(nNT)) characterized by a sampling interval (T) that is a factor of N times shorter than the sampling interval (NT) of the digital input signal (s(nNT)).

The first switch 50 acts to sample the digital input signal (s(nNT)) at a rate of 1/(NT) so that half of the samples travel on the first path 52 and the other half travel along the second path 58. This implements the additional factor of 2 in the sequence values s(2mNT) given in expressions (21) and (22).

The delay circuits 68, 72 add a delay of NT to signals travelling on the bottom path 58 and the bottom middle path 62, which were split from the first path 52 and the second path 54, respectively. The NT delays 68, 72 facilitate implementing the additional NT term in the sequence values s((2mN+N)T) of expressions (21) and (22).

The registers 64, 66, 70, 74 are clocked at rates of 1/(NT). The relative phase differences in clock signals (not shown) between the registers 64, 66, 70, 74 may be adjusted relative to the clocking of the second switch 76 and the third switch 80 to eliminate any timing errors. Those skilled in the art will appreciate that the delay circuits 68, 82 may be omitted and implemented directly via the corresponding registers 70, 74 without departing from the scope of the present invention.

The second switch 76 and the third switch 80 output s(2mNT) terms and s((2mN+N)T) terms, respectively, of the sequence given by expressions (21) and (22). The fourth switch 84 acts to interleave the s(2mNT) terms and the s((2mN+N)T) terms of the sequence given by expressions (21) and (22). The s(2mNT) terms arrive at the fourth switch on the top output path 78, while the s((2mN+N)T) arrive at the fourth switch on the bottom output path 82. The signs of the terms s(2mNT) and s((2mN+N T) are provided via the XOR circuit 88 and the sequence generator 90. The output of the XOR circuit 88 represents the sequence defined by expressions (22) and (22), which is a faster-rate approximation to the digital input signal s(nNT).

The signal interleaving operations performed by the second switch 76, third switch 80, and the fourth switch 84 implement so-called nearest neighbor interpolation. This operation is interpreted as a nearest neighbor interpolation, because the absolute values of the odd and even samples are held constant over an interval N and the values are the nearest neighbors along the coarse sample grid N, 2N, 3N, . . . .

Figure 5:
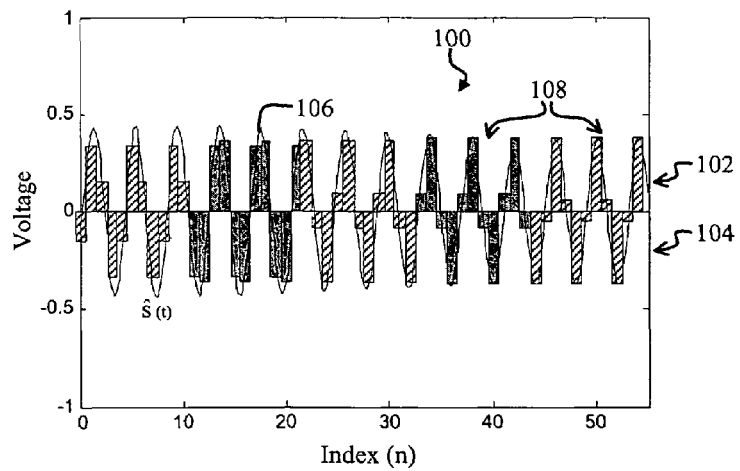
FIG. 5 is a graph illustrating an exemplary DAC pattern implemented via the pattern generator of FIG. 4.

FIG. 5 is a graph illustrating an exemplary DAC pattern 100 implemented via the pattern generator 40 of FIG. 4 as a function of voltage versus sample index (n), which represent discrete integer time values. The bit-sampling pattern 100 illustrates discrete positive values 102 and discrete negative values 104, which are grouped together in pairs. With reference to FIGS. 4 and 5, the pattern of positive values and negative values is consistent with the pattern output by the sequence generator 90, which is employed to determine the sign bits of the output values 102, 104, which are output from the pattern generator 40.

The various discrete values 102, 104 are based on an exemplary digital input signal that is to be represented by an accurate analog approximation (ŝ(t)) 106 to an ideal analog signal s(t) that is representative of the digital input signal s(nNT) to the pattern generator 40. In the specific example of FIG. 5, N is set to 11.

The various discrete values 102, 104 are employed by the DAC module 42 of FIG. 3 to generate the accurate analog approximation (ŝ(t)) 106. With reference to sequence (22), the DAC values 102, 104 are for an exemplary signal where (N−1)/2= 5, which is odd. The discrete values 102, 104 alternate between smaller and larger values as corresponding terms s(2mNT) and s(2mN+N)T) of the sequence of sequence (22) alternate.

Even-indexed values alternate in sign for periods of 2N, as do the odd-indexed values, which is consistent with the sequence given by sequence (22), which applies to the case wherein (N−1)/2 is odd. For example, note that for the discrete values 102, 104 indexed 12 through 33 (period of 22=2N=2×11), the even-indexed terms have similar absolute values but alternating signs. Note that different value patterns exist for even-indexed terms versus for odd-indexed terms, and the different patterns are interleaved to form the discrete values 102, 104.

The bars representing discrete values 102, 104 in the pattern 100 are shaded to show regions 108 where the DAC sequence pattern 100 is regular. Regular regions are regions wherein the absolute values of the odd-indexed values are equal and alternate in sign, and wherein the absolute values of the even-indexed values are equal and alternated in sign. These regions have length N for the uniform sampling case illustrated in the pattern 100. For the nonuniform sampling case, corresponding regular regions have length 2N, which is discussed more fully below.

Figure 6:
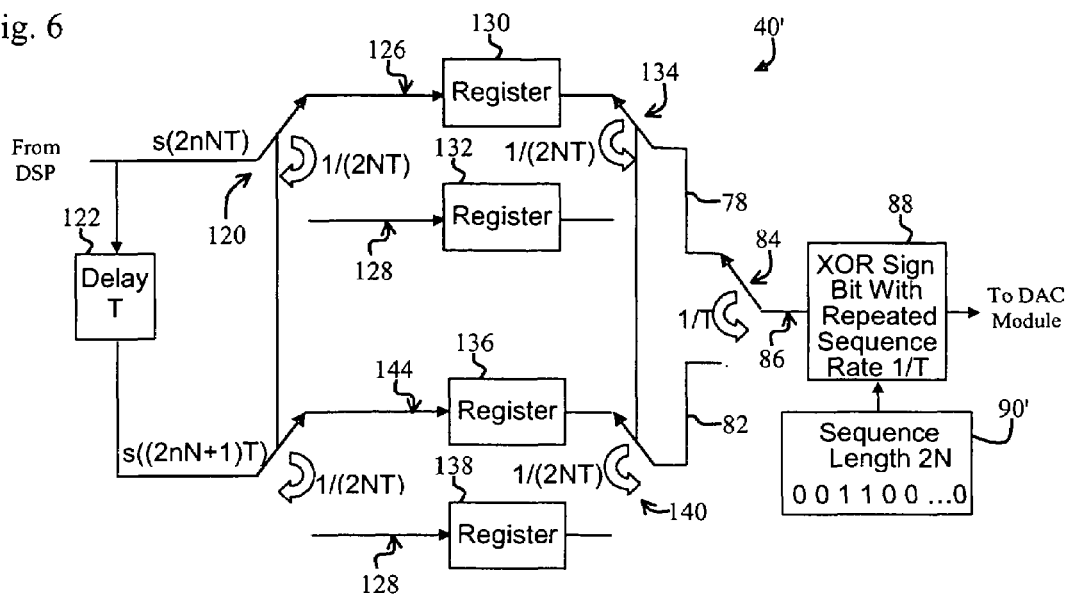
FIG. 6 is a more detailed diagram of a first alternative embodiment of the pattern generator of FIG. 4 adapted for nonuniform sampling.

FIG. 6 is a more detailed diagram of a first alternative embodiment 40' of the pattern generator 40 of FIG. 4 adapted for nonuniform sampling. The alternative pattern generator 40' receives an input signal (s(2nNT)), such as from the signal processor 16 of FIG. 1. The input signal (s(2nNT)) is characterized by a sampling rate of 1/(2nNT) and is input in parallel to a first input switch 120, which operates at a switching rate of 1/(2NT), and to a shift circuit 122. The shift circuit 122 delays or shifts the input signal by T and provides a shifted signal (s((2nN+1)T)) to a second input switch 124.

Note that the rate of the input signal to the pattern generator 40' is 1/(2NT) versus 1/(NT) for the corresponding input signal of the pattern generator 40 of FIG. 4. This half-rate input signal may be readily obtained by selectively delaying input samples via a memory buffer (not shown). Alternatively, the signal is initially provided from the signal processor 16 of FIG. 1 at a rate of 1/(2NT).

The first input switch 124 switches the input signal (s(2nNT)) onto a first top path 126 and a second path 128 at a rate of 1/(2NT) so that every 4NT seconds the top path 126 gets a new sample, and every 4NT seconds the second path 128 gets a new sample. The relative phases of signals on the top path 126 and the second path 128 are such that if the signals were superimposed, the resulting signals would exhibit samples every 2NT seconds, i.e., would exhibit a rate of 1/(2NT). The signals on the top path 126 and the second path 128 are input to a top register 130 and a second register 132, respectively, which are clocked at a rate of 1/(2NT), i.e., half the rate of the corresponding registers 64, 66 of FIG. 4. Outputs of the registers 130, 132 are input to terminals of a third switch 134, which operates at a rate of 1/(2NT). The third switch 134 switches the outputs of the registers 130, 132 onto to the top output path 78 at a rate of 1/(2NT).

The second input switch 124 provides output to a third register 136 and a bottom register 138 on a third path 144 and a bottom path 146, respectively. The third register 136 and the bottom register 138 provide input to a fourth switch 140. The second input switch 124, the registers 136, 138, and the fourth switch 140 operate similarly to the first input switch 120, registers 130, 132, and third switch 134, respectively. The fourth switch 140 provides output along the bottom output path 82.

The bottom output path 82 and the top output path 78 connect to the fourth switch 84, which provides output along the output path 86 and operates at a rate of 1/T. The output path 86 includes the XOR circuit 88 and the sequence generator 90'. Note that the top path 78, bottom path 82, and output path 86 are similar in construction and operation to corresponding paths of FIG. 4 with the exception that the sequence generator 90' provides a repeated sequence of length 2N versus N for the sequence generator 90 of FIG. 4. In the present embodiment, the repeated sequence exhibits a repeated subsequence of length 4 ({0011 . . . }) where the bits of the subsequence depend on whether (N−1)/2 is even or odd.

The relative timing of the third switch 134, fourth switch 140, and output switch 84 are set to facilitate signal interleaving for the nonuniform sampling case to produce the sequences represented in expressions (23) and (24). The resulting output sequence represents a higher-rate approximation to the input signal (s(2nNT)) that will yield an analog output signal having a desired bandwidth when input to a DAC module characterized by a desired rate, such as the module 42 of FIG. 3.

The registers 130, 132, 136, 138 buffer data to be input to the DAC module 42 of FIG. 3. This data is output by the pattern generator 40' and is buffered from critical switching of the DAC module 42 of FIG. 3 by the registers 130, 132, 136, 138. The loading of the registers 130, 132, 136, 138 of FIG. 6 is done in parallel, so that out of the four registers, 2 DAC words are loaded at a time, which is half of the rate of the corresponding registers 64, 66, 70, 74 for the uniform sampling case of FIG. 4. The exact lengths or sizes of the registers 130, 132, 136, 138 are application specific and may be readily determined by those skilled in the art with access to the present teachings without undue experimentation.

Note that the implementations of FIGS. 4 and 6 do not require multipliers, digital mixers, filters, or other arithmetic-performing circuits. The implementations involve efficient use of simple switches used as multiplexers and demultiplexers.

Figure 7:
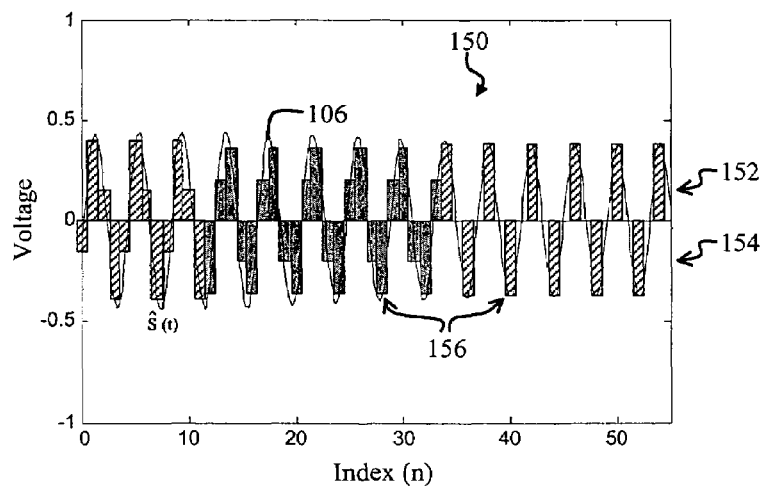
FIG. 7 is a graph illustrating an exemplary DAC pattern implemented via the pattern generator of FIG. 6.

FIG. 7 is a graph illustrating an exemplary DAC pattern 150 implemented via the alternative pattern generator 40' of FIG. 6. The nonuniform DAC pattern 150, which is input to the DAC module 42 of FIG. 3, is employed by the DAC module 42 to construct the exemplary analog signal (ŝ(t)) 106. In the present embodiment, which applies to the nonuniform sampling case, N is 11, and (N−1)/2 is 5, which is odd. Hence, the sequence given in expression (24) is applicable and is represented by the nonuniform pattern 150.

The pattern 150 includes positive values 152 and negative values 154, which are grouped in pairs so that two positive (or zero) values are followed by two negative (or zero) values, and so on, in accordance with the sequence provided by the sequence generator 90 of FIG. 6. Note that for the nonuniform sampling case, the nonuniform pattern 150 exhibits regular regions 156 that are 2N samples long, which is twice as long as the corresponding regular regions 108 of FIG. 5 for the uniform sampling case. With reference to FIGS. 5 and 7, the patterns 100, 150 illustrate differences between boundaries of even and odd-indexed sequences for uniform sampling and nonuniform sampling implementations, respectively.

Figure 8:
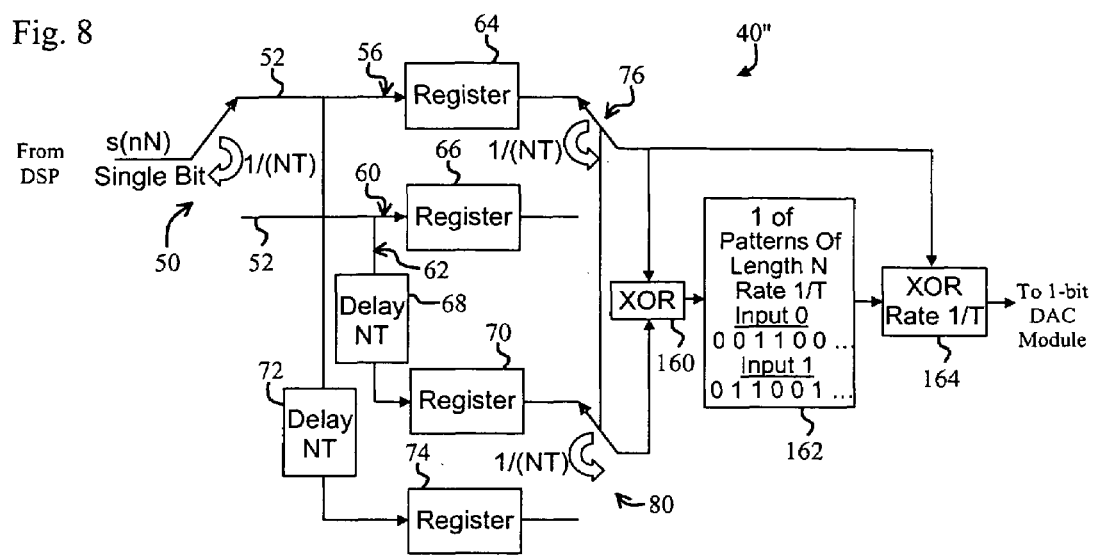
FIG. 8 is a more detailed diagram of a second alternative embodiment of the pattern generator of FIG. 4 adapted for use with a 1-bit DAC module and uniform sampling.

FIG. 8 is a more detailed diagram of a second alternative embodiment 40" of the pattern generator 40 of FIG. 4 adapted for use with a 1-bit DAC module and uniform sampling. The construction of the alternative pattern generator 40" of FIG. 8 is similar to the construction of the pattern generator 40 of FIG. 4 with the exception that the output switch 84, the XOR circuit 88, and the sequence generator 90 of FIG. 4 are replaced with a first XOR circuit 160, an alternative pattern generator 162, and a second XOR circuit 164 in FIG. 8.

The output of the third switch is input to the first XOR circuit 160 and the second XOR circuit 164. The first XOR circuit 160 applies an exclusive OR operation employing the outputs of the second switch 76 and third switch 80, and the result is input to the alternative pattern generator 162. The alternative pattern generator 162 then determines the appropriate sequence value to input to the second XOR circuit 164 in response thereto. The alternative pattern generator 162 is employed to facilitate determining the signs of terms output by the second switch 76 and the third switch 80.

The second XOR circuit 164 applies an exclusive OR operation on the output of the alternative pattern generator 160 and the output of the second switch 76 and outputs the result at a rate of 1/T. The output of the second XOR circuit 164 represents the output of the alternative pattern generator 40."

The pattern generator 162 selects one of four pattern sequences based on input from the first XOR circuit 160. In the present embodiment, the patterns each have length N and are given by the following:

Pattern 1: 0 0 1 1 0 0 1 1 . . .
Pattern 2: 1 1 0 0 1 1 0 0 . . .
Pattern 3: 0 1 1 0 0 1 1 0 . . .
Pattern 4: 1 0 0 1 1 0 0 1 . . .

In the present specific embodiment, if the output of the first XOR circuit 160 represents 1, i.e., a high voltage state, then pattern 3 is output by the alternative pattern generator 162 at a rate of 1/T. If the output of the first XOR circuit 160 represents 0, i.e., a low voltage state, then pattern 1 is output by the alternative pattern generator 162 at a rate of 1/T. Note that the alternative pattern generator 162 provides N outputs before a new in put is received from the first XOR circuit 160, which may then cause the alternative pattern generator 162 to output a different sequence for the next N samples at a rate of 1/T. This is consistent with the fact that the inputs to the first XOR circuit 160 switch at a rate of 1/(NT), which is N times slower than the output of the alternative pattern generator, which is 1/T.

Figure 9:
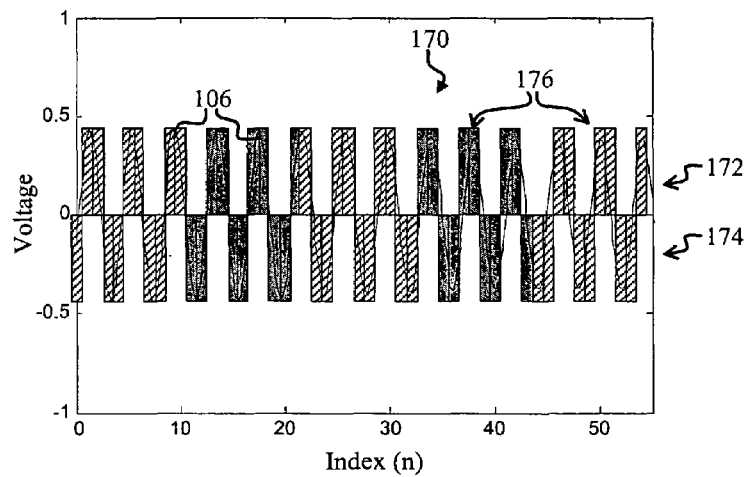
FIG. 9 is a graph illustrating an exemplary DAC pattern implemented via the pattern generator of FIG. 8.

FIG. 9 is a graph illustrating an exemplary DAC pattern 170 implemented via the pattern generator of FIG. 8. The DAC input pattern 170, which corresponds to the output of the alternative pattern generator 40", is optimized for a 1-bit DAC module and uniform sampling. The DAC input pattern 170 is plotted as voltage versus discrete time index (n).

The exemplary uniform DAC pattern 170 includes positive values 172 and negative values 174, which are employed by a subsequent 1-bit DAC module (see 42 of FIG. 3) to provide an analog approximation (ŝ(t)) 106 to an ideal analog output signal representative of the digital input signal s(nN) to the pattern generator 40". The positive and negative values 172, 174 have signs (positive or negative) that are consistent with the pattern sequences output by the alternative pattern generator 162 of FIG. 8.

The uniform DAC pattern 170 exhibits regular regions 176 of period N. This is consistent with the fact that the patterns output by the alternative pattern generator 162 are of length N. For the nonuniform 1-bit DAC implementation, the corresponding regular regions exhibit periods of 2N, as is discussed more fully below.

The alternative pattern generator 40" efficiently employs only two relatively high-speed circuits: the alternative pattern generator 162 and the second XOR circuit. 164. The alternative pattern generator 40" requires no arithmetic operations such as signal mixing or multiplying.

Figure 10:
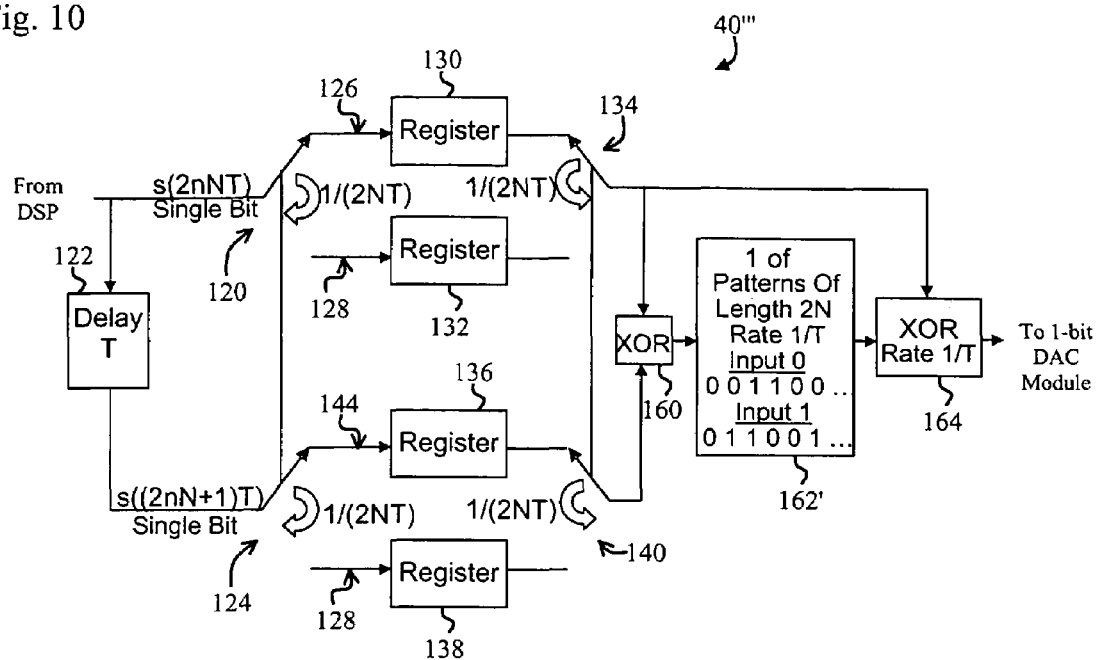
FIG. 10 is a more detailed diagram of a third alternative embodiment of the pattern generator of FIG. 4 adapted for use with a 1-bit DAC module and nonuniform sampling.

FIG. 10 is a more detailed diagram of a third alternative embodiment 40'" of the pattern generator 40 of FIG. 4 adapted for use with a 1-bit DAC module and nonuniform sampling. The third alternative pattern generator 40'" is similar to the first alternative pattern generator 40' of FIG. 6 with the exception that the fifth switch 84, XOR circuit 88, and sequence generator 90' of FIG. 6 are replaced with the first XOR circuit 160, and the second XOR circuit 164 of FIG. 8 and a second alternative pattern generator 162'.

The first XOR circuit 160, the second alternative pattern generator 162', and second XOR circuit 164 of FIG. 10 are interconnected connected similarly to the corresponding components 160–164 of the alternative pattern generator 40" of FIG. 8. The second alternative pattern generator 162' is similar to the alternative pattern generator 162 of FIG. 8 with the exception that the second alternative pattern generator 162' outputs patterns of length 2N instead of length N.

Figure 11:
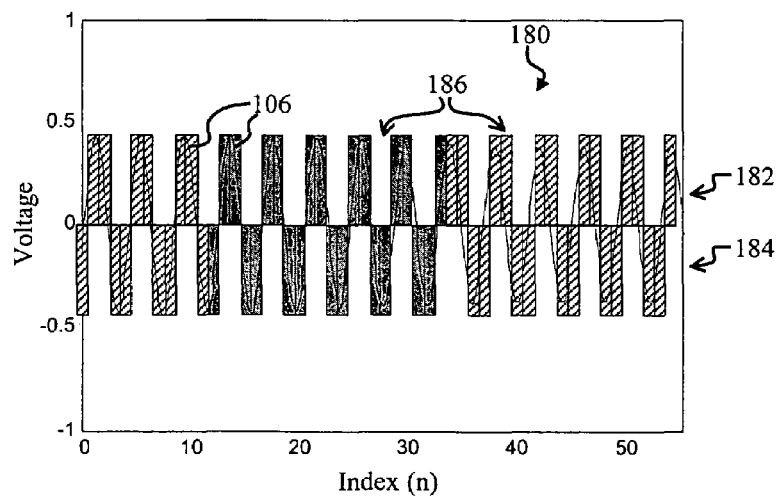
FIG. 11 is a graph illustrating an exemplary DAC pattern implemented via the pattern generator of FIG. 10.

FIG. 11 is a graph illustrating an exemplary DAC input pattern 180 implemented via the third alternative pattern generator 40'" of FIG. 10. The DAC input pattern 170, which corresponds to the output of the alternative pattern generator 40'", is optimized for a 1-bit DAC module and nonuniform sampling. The DAC input pattern 180 is plotted as voltage versus discrete time index (n).

The exemplary uniform DAC pattern 170 includes positive values 182 and negative values 184, which are employed by a subsequent 1-bit DAC module (see 42 of FIG. 3) to provide the analog approximation (ŝ(t)) 106 to an ideal analog output signal representative of the digital input signal s(nN) to the pattern generator 40". The positive and negative values 182, 184 have signs (positive or negative) that are consistent with the pattern sequences output by the alternative pattern generator 162 of FIG. 10.

The uniform DAC pattern 180 exhibits regular regions 186 of period 2N. This is consistent with the fact that the patterns output by the alternative pattern generator 162 are of length 2N.

The alternative pattern generator 40'" efficiently employs only two relatively high-speed circuits: the second alternative pattern generator 162' and the second XOR circuit 164. The alternative pattern generator 40'" requires no arithmetic operations such as signal mixing or multiplying.

Figure 12:
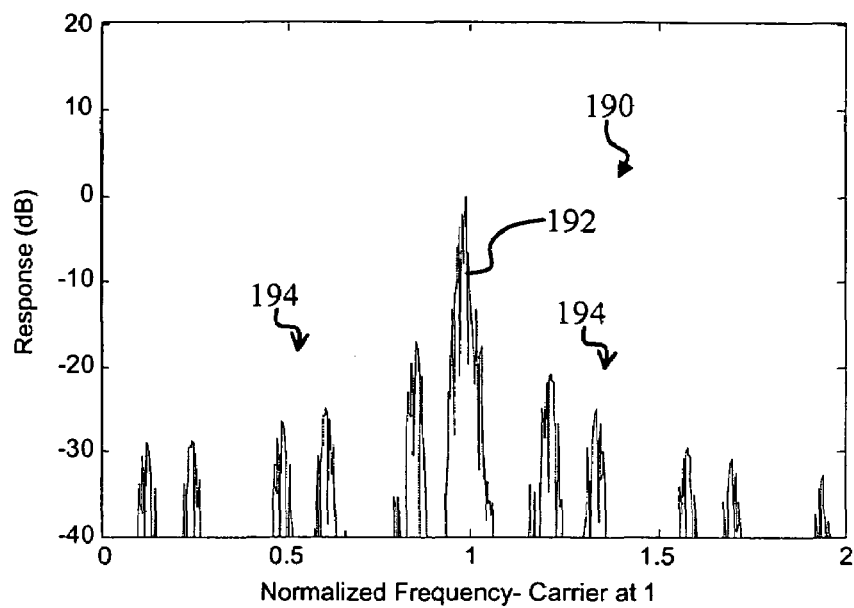
FIG. 12 is a graph illustrating the spectral response of the rate-converting DAC of FIG. 1 for an exemplary digital input signal.

FIG. 12 is a graph illustrating the spectral response 190 of the rate-converting DAC of FIG. 1 for an exemplary digital input signal. The spectral response 190 is plotted as Decibels (dB) versus frequency, which is normalized at a carrier frequency of 1. The spectral response 190 includes a primary spectral peak 192 centered at 1, which is surrounded by small alias components 194, which are easily filtered.

Figure 13:
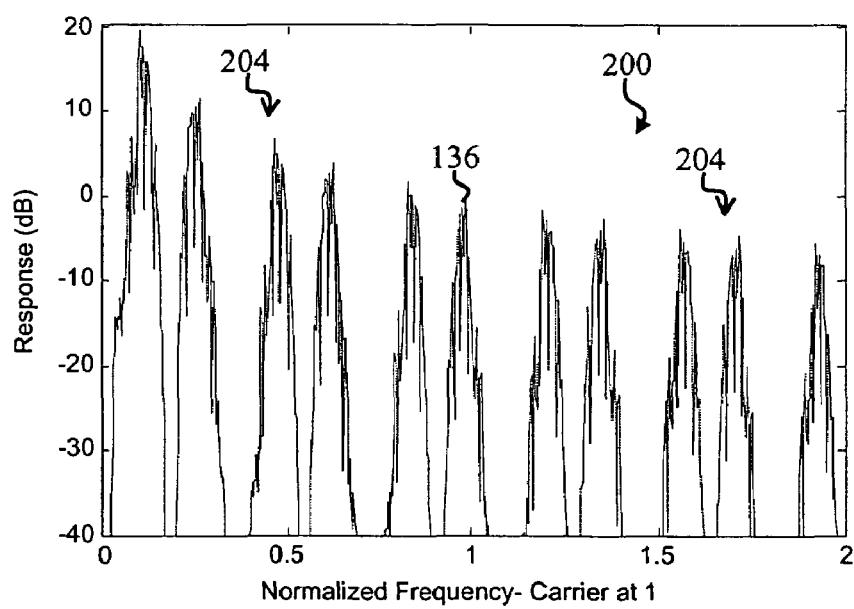
FIG. 13 is a graph of illustrating the spectral response of a conventional DAC based on the exemplary digital input signal employed to generate the graph of FIG. 12.

FIG. 13 is a graph of illustrating the spectral response 200 of a conventional DAC (not shown) based on the exemplary digital input signal used to generate the graph of FIG. 12. The spectral response 200 is plotted as Decibels (dB) versus frequency, which is normalized at the carrier frequency of 1. The spectral response 200 includes a primary spectral peak 202, which is centered at 1, which is surrounded by relatively large alias components 204. The large alias components 204 are significantly larger than the corresponding alias components 194 in the spectral response 190 of FIG. 12 for a DAC constructed in accordance with the teachings of the present invention. The larger alias components 194 represent additional filtering which must be performed on the output signal to isolate the desired signal components.

Figure 14:
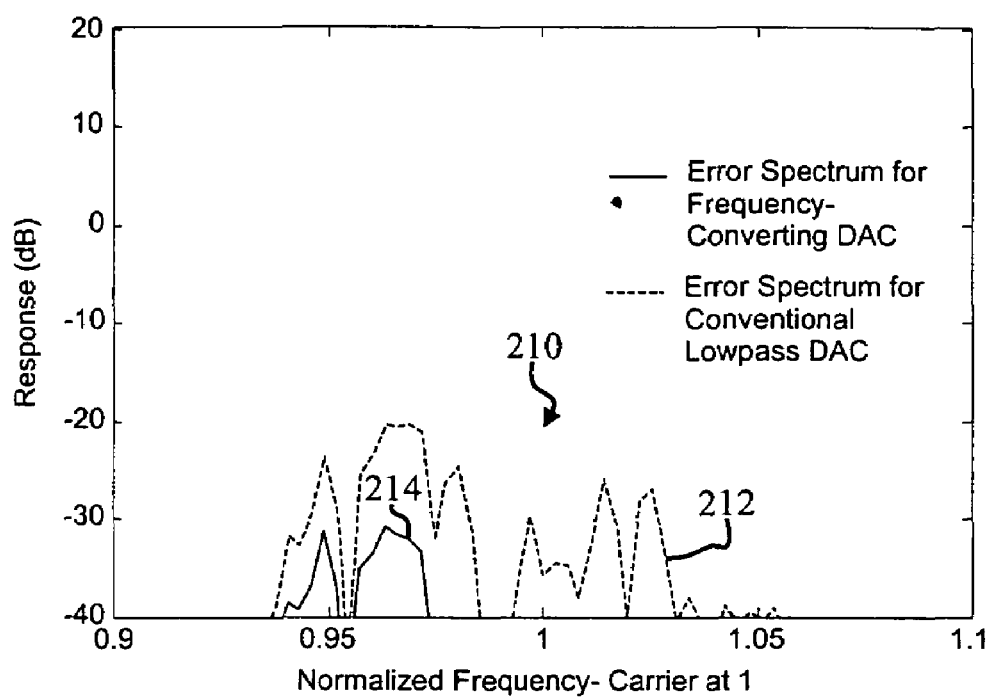
FIG. 14 is a graph comparing error signals associated with spectral responses graphed in FIGS. 12 and 13, respectively.

FIG. 14 is a graph comparing error signals 210 associated with spectral responses 190, 202 graphed in FIGS. 12 and 13, respectively. The error signals 210 are plotted as Decibels (dB) versus frequency, which is normalized at 1. The error signals 210 include a first error signal 212 corresponding to the spectral response 200 of FIG. 13 and a second error signal 214 corresponding to the spectral response 190 of FIG. 12. Note that the error signal 212, which corresponds to an error signal produced by a DAC constructed according to an embodiment of the present invention, is significantly smaller than the corresponding error signal 212 produced by a conventional DAC.

Thus, the present invention has been described herein with reference to a particular embodiment for a particular application. Those having ordinary skill in the art and access to the present teachings will recognize additional modifications, applications, and embodiments within the scope thereof.

It is therefore intended by the appended claims to cover any and all such applications, modifications and embodiments within the scope of the present invention.

Accordingly,

What is claimed is:

1. A digital signal-rate converting system comprising:
first means for receiving a digital input signal characterized by a first rate; and
second means for interleaving said digital input signal in accordance with a predetermined pattern and providing an adjusted-rate digital signal in response thereto, said adjusted-rate digital signal representative of said digital input signal;
wherein said digital signal-rate converting system is an input interface of a rate-converting Digital-to-Analog converter (DAC),
wherein said rate-converting DAC includes a 1-bit DAC module for receiving said adjusted-rate digital signal and providing an analog output signal with a desired bandwidth or center frequency in response thereto, and
wherein said adjusted-rate digital signal is an approximation of said digital input signal and is characterized by a rate based on a desired center frequency of said analog output signal.

2. The system of claim 1 wherein said DAC module includes a high-speed DAC characterized by a DAC hold rate that matches a rate of said adjusted-rate digital signal.

3. The system of claim 2 wherein said first rate is 1/(NT), where N is a constant integer, and said DAC hold rate is 1/T.

4. The system of claim 3 wherein N is chosen relative to said DAC rate so that a bandpass center frequency ($f_c$) of said analog output signal is 1/(4T), and wherein said rate of said digital input signal is (4/N)$f_c$.

5. The system of claim 4 wherein N is an odd integer.

6. The system of claim 2 wherein said input interface further includes plural sampling switches for increasing a rate of said digital input signal by a factor of N and selectively interleaving portions of said digital input signal at predetermined rates to facilitate providing said adjusted-rate signal.

7. The system of claim 2 wherein said input interface includes a sequence generator for applying a pattern to said digital input signal to facilitate establishing appropriate signs of bits of said adjusted-rate digital signal.

8. A rate-converting Digital-to-Analog Converter (DAC) comprising:
an input interface for receiving a digital input signal characterized by a first rate, interleaving said digital input signal in accordance with a predetermined pattern, and providing an adjusted-rate digital signal in response thereto; and
a DAC module for receiving said adjusted-rate digital signal and providing an analog output signal with a desired bandwidth or center frequency in response thereto
wherein said adjusted-rate digital signal is an approximation of said digital input signal and is characterized by a rate based on a desired center frequency of said analog output signal,
wherein said DAC module includes a high-speed DAC characterized by a DAC hold rate that matches a rate of said adjusted-rate digital signal, and
wherein said first rate is 1/(NT), where N is a constant integer, and said DAC hold rate is 1/T.

9. The system of claim 8 wherein N is chosen relative to said DAC rate so that a bandpass center frequency ($f_c$) of said analog output signal is 1/(4T), and wherein said rate of said digital input signal is (4/N)$f_c$.

10. The system of claim 9 wherein N is an odd integer.

11. The system of claim 8 wherein said input interface further includes plural sampling switches for increasing a rate of said digital input signal by a factor of N and selectively interleaving portions of said digital input signal at predetermined rates to facilitate providing said adjusted-rate signal.

12. The system of claim 11 wherein said input interface includes a sequence generator for applying a pattern to said digital input signal to facilitate establishing appropriate signs of bits of said adjusted-rate digital signal.

13. The system of claim 11 wherein said pattern is based on an approximation of an input signal, and wherein said plural sampling switches are arranged based on said approximation, said adjusted-rate digital signal being representative of said approximation.

14. The system of claim 13 wherein said approximation is obtained by subsampling a representation of said digital input signal by a factor of 2N, where N is a predetermined integer and interpolating via nearest-neighbor interpolation.

15. The system of claim 14 wherein said approximation is given by the following equations:

for uniform sampling $$\hat{s}(nT) = \sum_m d(n-2mN)s(2mNT) + \sum_m d(n-2mN-N)s((2mN+N)T)$$

for nonuniform sampling $$\hat{s}(nT) = \sum_m d(n-2mN)s(2mN) + \sum_m d(n-2mN-1)s((2mN+1)T)$$

where d(n) represents a discrete DAC pattern and is given by the following equation:

$$d(n) = \begin{cases} (-1)^{n/2} & -N \le n \le N-1 \text{ and } n \text{ even} \\ 0 & \text{Otherwise} \end{cases}$$

where ŝ(nT) is an approximation of an input signal s(nT), where n is a digital time variable, and m is a variable whole number.

16. A digital signal-rate converting system comprising:
first means for receiving a digital input signal and providing samples of said digital input signal at a first rate in response thereto;
second means for selectively delaying a portion of said samples of said digital input signal and providing delayed samples in response thereto; and
third means for selectively interleaving, at a second rate, samples of said delayed samples output by said second means with samples output by said first means and providing a digital output signal characterized by second rate in response thereto, said digital output signal an approximation of said digital input signal,
wherein said digital signal-rate converting system is an input interface to a Digital-to-Analog converter that converts said digital output signal to an analog bandpass representation of said digital input signal.

17. A rate-converting Digital-to-Analog Converter (DAC) comprising:
first means for receiving a digital input signal and providing samples of said digital input signal at a first rate in response thereto;
second means for selectively delaying a portion of said samples of said digital input signal and providing delayed samples in response thereto;
third means for selectively interleaving, at a second rate, samples of said delayed samples output by said second means with samples output by said first means and providing a digital interleaved signal characterized by second rate in response thereto; and
fourth means for converting said digital interleaved signal to an analog bandpass representation of said digital input signal.

18. The system of claim 17 wherein said fourth means includes a high-speed Digital-to-Analog Converter (DAC) having a hold rate of (1/T), where T is a sampling period of said digital interleaved signal output by said third means.

19. The system of claim 18 wherein said first means includes a first switch for subsampling said digital input signal at said first rate, which is 1/(NT), where N is a predetermined constant integer, said switching providing two initial output paths.

20. The system of claim 19 wherein said second means includes means for splitting said two initial output paths into four output paths, and wherein said second means further includes a first delay circuit and a second delay circuit applied a third and fourth path of said four output paths, said first and second delay circuits delaying said samples by NT and providing said delayed samples as output in response thereto.

21. The system of claim 20 wherein said second means further includes four registers, one register connected to each of said four output paths.

22. The system of claim 21 wherein said third means includes a second switch operating at a rate of 1/(NT) and switching between a first path and a second path of said four output paths, and wherein said third means includes a third switch operating at a rate of 1/(NT) and switching between said third path and fourth paths.

23. The system of claim 22 wherein said third means further includes a fourth switch operating at a rate of 1/(T) and switching between an output of said second switch and an output of said third switch and providing an intermediate digital interleaved signal in response thereto.

24. The system of claim 23 wherein said third means further includes an exclusive-OR circuit adapted to determine signs of samples of said digital interleaved signal based on a predetermined input sequence.

25. The system of claim 24 wherein said exclusive-OR circuit is adapted to apply an exclusive-OR operation between said predetermined input sequence and sign bits of said intermediate digital interleaved signal generated by said third means, providing appropriate sign bits in response thereto, said exclusive-OR circuit applying said appropriate sign bits to said intermediate digital interleaved signal to yield said digital interleaved signal output by said third means.

26. The system of claim 25 wherein said DAC is 1-bit DAC.

27. The system of claim 17 wherein said second means includes means for splitting said digital input signal into a first digital signal and a second digital signal, said second digital signal delayed by a time T relative to said first digital signal.

28. The system of claim 27 wherein said input digital signal along said first branch is a function of 2mNT, and wherein said digital input signal is a function of (2mN+1)T and/or (2mN+N)T, where n is a digital time variable; N is a predetermined constant integer.

29. The system of claim 28 wherein said digital interleaved signal exhibits regular regions of length N for uniform sampling implementations and of length 2N for non-uniform sampling implementations.

30. The system of claim 28 wherein said second means further includes a first switch for switching said first signal onto a first path and a second path at a rate of 1/(2NT), and further includes a second switch for switching said second signal onto a third path and a fourth path at a rate of 1/(2NT).

31. The system of claim 30 wherein said third means includes a third switch that switches signals on said first path and said second path onto an output path of said third switch at a rate of 1/(2NT), and wherein said third means includes a fourth switch that switches signals on said third path and said fourth path onto an output path of said fourth switch at a rate of 1/(2NT).

32. The system of claim 31 wherein said third means further includes a fifth switch that switches signals on said output path of said third switch and said output path of said fourth switch onto an output of said fifth switch at a rate of 1/T.

33. The system of claim 32 wherein said third means further includes means for selectively adjusting sign bits of a signal on said output path of said fourth switch in accordance with a predetermined sequence.

34. The system of claim 33 wherein said predetermined sequence includes subsequences of length 2N, and wherein said sequence is substantially formed from alternating pairs of low states and high states.

35. The system of claim 34 wherein said means for selectively adjusting sign bits includes one or more exclusive-OR circuits.

36. A system for converting a digital input signal characterized by a first center frequency to an analog output signal characterized by a second center frequency comprising:
a first circuit that samples a digital input signal and provides plural digital output signals in response thereto, one or more of said digital output signals being delayed by a predetermined interval;
a second circuit that selectively interleaves said plural digital output signals at a predetermined rate and provides a digital interleaved signal in response thereto, wherein said predetermined rate is a reciprocal of said predetermined interval; and a digital-to-analog converter module adapted to convert said digital interleaved signal to an output signal having a desired center frequency, which is a function of said predetermined interval, wherein said first circuit is characterized by a first sampling rate, which is a factor of N slower than said predetermined rate, and wherein said digital-to-analog converter module operates at a rate sufficient to provide said analog output signal with a bandpass center frequency at $1/(4T)$, where T is said predetermined interval.

37. A method for converting a digital signal into an analog signal having a desired center frequency comprising:

subsampling said digital signal by predetermined factor and interpolating via nearest-neighbor interpolation to yield a digital approximation to said digital signal, said digital approximation characterized by a desired rate, wherein said predetermined factor is 2N, where N is an odd integer; and converting said digital approximation to an analog signal having a center frequency based on said desired rate.

38. A bandpass delta sigma ($\Delta\Sigma$) modulator comprising:

an adder having a first input terminal and a second input terminal, said first input terminal receiving a bandpass analog signal;

a bandpass filter connected at an output of said adder;

a quantizer connected at an output of said bandpass filter;

a bandpass Digital-to-Analog Converter (DAC) connected at an output of said quantizer and providing feedback to said second input terminal of said adder;

an input interface for receiving a digital input signal characterized by a first rate, interleaving said input signal in accordance with a predetermined pattern, and providing an adjusted-rate digital signal in response thereto, and a DAC module for receiving said adjusted-rate digital signal and providing an analog output signal with a desired bandwidth or center frequency in response thereto.

39. A transmitter comprising:

a processor that provides a digital output signal at a first rate;

a rate-converting Digital-to-Analog Converter (DAC) adapted to convert said digital output signal to a Radio-Frequency (RF) signal;

first means for transmitting said radio frequency signal, said first means including a duplexer in communication with an antenna;

an input interface for receiving a digital input signal characterized by a first rate, interleaving said input signal in accordance with a predetermined pattern, and providing an adjusted-rate digital signal in response thereto; and a DAC module for receiving said adjusted-rate digital signal and providing an analog output sigla with a desired bandwidth or center frequency in response thereto.

40. The system of claim 39 further including a receive chain for receiving an RF signal via said antenna and said duplexer and converting said RF signal into a digital signal via a bandpass delta sigma ($\Delta\Sigma$) modulator and providing said digital signal to said processor in response thereto.

41. The system of claim 40 wherein said bandpass $\Delta\Sigma$ modulator includes:

an adder having a first input terminal and a second input terminal, said first input terminal receiving a bandpass analog signal;

a bandpass filter connected at an output of said adder;

a quantizer connected at an output of said bandpass filter; and a bandpass Digital-to-Analog Converter (DAC) connected at an output of said quantizer and providing feedback to said second input terminal of said adder.

42. A method for converting a digital signal into an analog signal having a desired center frequency comprising:

subsampling said digital signal by predetermined factor and interpolating via nearest-neighbor interpolation to yield a digital approximation to said digital signal, said digital approximation characterized by a desired rate, including employing a circuit characterized by a pattern to be applied to said digital signal to yield said digital approximation signal; and converting said digital approximation to an analog signal having a center frequency based on said desired rate.

* * * * *